United States Patent [19]

Gallego

[11] Patent Number: 4,592,306
[45] Date of Patent: Jun. 3, 1986

[54] APPARATUS FOR THE DEPOSITION OF MULTI-LAYER COATINGS

[75] Inventor: José M. Gallego, Ormskirk, England

[73] Assignee: Pilkington Brothers P.L.C., Mersyside, England

[21] Appl. No.: 676,977

[22] Filed: Nov. 30, 1984

[30] Foreign Application Priority Data

Dec. 5, 1983 [GB] United Kingdom ................. 8332394

[51] Int. Cl.$^4$ ...................... C23C 14/56; C23C 16/50
[52] U.S. Cl. .................................... 118/719; 118/723; 118/729; 118/50.1; 118/733; 118/726; 118/500; 414/217
[58] Field of Search ............... 118/723, 719, 728, 729, 118/50.1, 733, 730, 726, 500; 414/217, 221

[56] References Cited

U.S. PATENT DOCUMENTS

| | | | |
|---|---|---|---|
| 3,404,661 | 10/1968 | Mathias et al. | 118/719 |
| 3,931,789 | 1/1976 | Kakei et al. | 118/730 |
| 4,058,430 | 11/1977 | Suntola et al. | 118/730 X |
| 4,201,152 | 5/1980 | Luscher | 118/500 X |
| 4,498,416 | 2/1985 | Bouchaib | 118/500 |
| 4,500,407 | 2/1985 | Boys et al. | 414/217 X |
| 4,508,049 | 4/1985 | Behn et al. | 118/719 X |
| 4,508,590 | 4/1985 | Kaplan | 118/729 |
| 4,542,712 | 9/1985 | Sato | 118/500 X |

*Primary Examiner*—Bernard F. Plantz
*Attorney, Agent, or Firm*—Sughrue, Mion, Zinn, Macpeak & Seas

[57] ABSTRACT

Compact and versatile apparatus for deposition of multi-layer coatings on substrates at reduced pressure comprises at least 3 and preferably at least 4 evacuable deposition chambers, means for evacuating each of said deposition chambers and coating means in each of said deposition chambers for depositing a coating layer on a substrate; an evacuable transfer chamber with closable ports between said transfer chamber and each of said coating chambers for transfer of a substrate to be coated between said deposition chambers; means for evacuating said transfer chamber; and transfer means for transferring a substrate between said deposition chambers via the transfer chamber. The apparatus is especially useful for the production of photovoltaic cells in which the active layers are formed of amorphous silicon deposited from a glow discharge.

16 Claims, 8 Drawing Figures

APPARATUS FOR THE DEPOSITION OF MULTI-LAYER COATINGS

BACKGROUND OF THE INVENTION

The invention relates to an apparatus for the production of multi-layer coatings at reduced pressure.

UK patent specification No. 1,545,897 discloses semiconductor devices, useful as photovoltaic cells, in which a substrate coated with a coating comprising a layer of undoped amorphous silicon (an intrinsic layer) produced by glow discharge is sandwiched between thinner layers of n-doped and p-doped amorphous silicon also produced by glow discharge. In the production of such cells, it is important, in order to maximise the efficiency of the cells, to avoid any contamination of any one silicon layer with a dopant used to produce another layer. It has therefore been proposed that the different silicon layers should be deposited in separate chambers to reduce the risk of cross-contamination, and an apparatus comprising a line of consecutive separate vacuum chambers has been proposed for the mass production of such cells. Unfortunately the productivity of an in-line apparatus is limited by the time taken to deposit the thicker intrinsic layers, and if similar sized chambers are provided for the deposition of each of the layers, the chambers for deposition of the n-doped and p-doped layers are under-utilised.

This problem is alleviated in the apparatus described in European patent specification No. 60,651; the apparatus comprises a line of 3 separate deposition chambers through which a continuous ribbon of metal foil to be coated is advanced. By making the lengths of the separate deposition chambers approximately proportional to the deposition times required for the different coating layers, the overall efficiency of the apparatus may be improved. However, this involves the use of a long and expensive vacuum chamber for the intrinsic layer, and a continuous process increases the risk of cross-contamination between the deposition chambers.

SUMMARY OF THE INVENTION

According to the present invention, there is provided an apparatus for the deposition of multi-layer coatings on substrates comprising at least 3 evacuable deposition chambers, means for evacuating each of said deposition chambers and coating means in each of said deposition chambers for depositing a coating layer on a substrate, an evacuable transfer chamber with closable ports providing communication between said transfer chamber and each of said deposition chambers for transfer of a substrate to be coated between said deposition chambers, means for evacuating said transfer chamber, and transfer means for transferring the substrate between said deposition chambers via the transfer chamber.

An apparatus in accordance with the invention with only three deposition chambers is most useful for the application of two layer coatings in which the deposition time for one of the layers is about twice that for the other layer. For the production of the 3 layer amorphous silicon coatings described above, an apparatus according to the invention with at least 4 deposition chambers is preferred.

According to a preferred aspect of the invention, there is provided an apparatus comprising at least 4 evacuable deposition chambers, means for evacuating each of said deposition chambers and coating means in each of said chambers for depositing a coating layer on a substrate, an evacuable transfer chamber with closable ports providing communication between said transfer chamber and each of said deposition chambers for transfer of a substrate to be coated between said deposition chambers, means for evacuating said transfer chamber, and transfer means for transferring a substrate between said deposition chambers via the transfer chamber.

A single pump may be used to evacuate the deposition chambers and transfer chamber. However, at least in so far as the deposition chambers are used for the deposition of different coatings, it is generally preferred to provide each deposition chamber with its own independent evacuation system and pump in order to minimise the risk of cross-contamination between the chambers. Similarly, it is preferred that the transfer chamber should be provided with its own independent evacuation system and pump. In operation of the apparatus, the transfer chamber is preferably maintained at lower pressure than any of the deposition chambers to avoid any gas which has entered the transfer chamber from one deposition chamber being drawn into any other deposition chamber and causing contamination of the coating deposited in that chamber.

Each deposition chamber is provided with means for depositing a coating on the substrate. The nature of this coating means will depend on the nature of the coating to be deposited. When it is desired to deposit a silicon coating by a glow discharge technique, the apparatus preferably comprises means for supplying a coating gas to each of said deposition chambers and each of said deposition chambers is provided with electrode means for generation of a glow discharge in that chamber with deposition of a coating on a substrate in that chamber.

The transfer chamber is in interruptable communication through closable ports with each of the deposition chambers for transfer of a substrate to be coated between chambers. A compact arrangement may be achieved by disposing the deposition chambers on the arc of a circle around the transfer chamber. Each of the deposition chambers preferably opens directly into the transfer chamber, with a closable port separating the deposition chamber from the transfer chamber. The closures between the transfer chamber and the deposition chamber restrict the flow of gas between the deposition chambers and the transfer chamber and preferably provide gas tight seals between the chambers.

The transfer means for transferring the substrate between the chambers is preferably mounted in the transfer chamber and operable to transfer a substrate from the transfer chamber into and out of the deposition chambers. Preferably, it includes an arm rotatably mounted in the transfer chamber. The deposition chambers are then conveniently disposed on the arc of a circle about the axis of rotation of the arm, and preferably extend either parallel to that axis or radially away from that axis. In a preferred embodiment, the rotatably mounted arm is radially reciprocal and the deposition chambers are disposed on the arc of a circle about the axis of rotation of the arm and extend radially away from that axis. In use of this embodiment, the arm may rotate carrying the substrate to a position adjacent the entrance port of a deposition chamber and then advance radially carrying the substrate into the adjacent deposition chamber, release the substrate and retract. The deposition chamber is then closed off from the transfer chamber and a layer of coating material deposited on the substrate. The deposition chamber is then opened to the transfer chamber and the transfer means may operate to withdraw the substrate from the deposition chamber, rotate to a position adjacent the entrance port of a second deposition chamber, and the sequence be repeated.

The apparatus preferably includes an evacuable chamber, with means for evacuating that chamber, for introducing a substrate to be coated. The evacuable chamber preferably opens into the transfer chamber, but may alternatively open into one of the deposition chambers. Thus the apparatus preferably includes, in addition to the deposition chambers, at least one evacuable inlet and/or outlet chamber with a closable entry port for introduction and/or removal of a substrate, means for evacuating said inlet/outlet chamber, and a closable port for transfer of a substrate between said chamber and the transfer chamber.

The apparatus may further include an additional evacuable deposition chamber for deposition of a metal layer. Thus, in a preferred aspect of the invention, the apparatus comprises an additional evacuable deposition chamber, a closable port between said additional chamber and the transfer chamber, means for evacuating said additional chamber, and heating means in said chamber for evaporation of a metal and deposition of a coating of said metal on a substrate in the chamber.

Apparatus in accordance with the present invention has important advantages over an in-line apparatus of similar capacity. It may be smaller and more compact, and consequently cheaper. The coating processes and deposition times in the individual chambers may be varied independently, and individual deposition chambers may be isolated for maintenance or modification while the remaining chambers remain available for use.

BRIEF DESCRIPTION OF THE DRAWINGS

The invention is illustrated but not limited by the following description with reference to the accompanying drawings in which.

DETAILED DESCRIPTION

Figure 1:
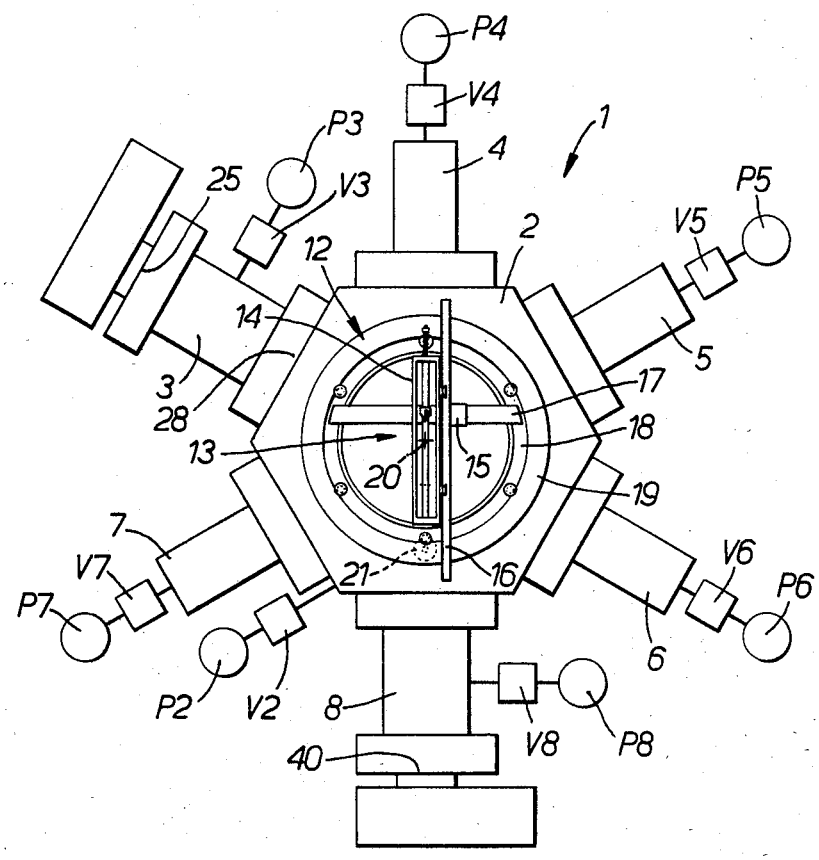
FIG. 1 is a schematic plan view of an apparatus in accordance with the invention showing the general layout of the apparatus and transfer mechanism.

The apparatus, generally designated 1, shown in FIG. 1 comprises a generally hexagonal central transfer chamber 2 with closable ports opening from the transfer chamber 2 into an inlet chamber 3 of circular section, four similar deposition chambers 4, 5, 6 and 7 of rectangular vertical section for deposition of amorphous silicon layers by glow discharge and a deposition chamber 8 of circular section for deposition of a metal layer, which also serves as an outlet chamber. The transfer chamber 2 is connected to a pump P2 via valve V2 for evacuation of the chamber and is provided with transfer means, generally designated 12, and including a transfer arm generally designated 13 rotatable about vertical axis 20 at the centre of chamber 2. The transfer mechanism is more fully described hereafter with reference to FIGS. 6, 7 and 8. Referring to FIG. 1, it will be seen that the coating chambers are disposed on the arc of a circle about the axis 20 of rotation of the transfer arm 13 and extend radially away from that axis.

The inlet chamber 3 has a loading port at 25 controlled by a slide valve similar to valve 33 (see below) for introduction of substrates to be coated mounted on a substrate carrier described in detail below. The inlet chamber is connected to a pump P3 via valve V3 for evacuation of the chamber. Infra red heaters are provided in inlet chamber 3 and the inlet chamber 3 opens into transfer chamber 2 by a port at 28 controlled by a slide valve similar to valve 33 (see below).

Figure 2:
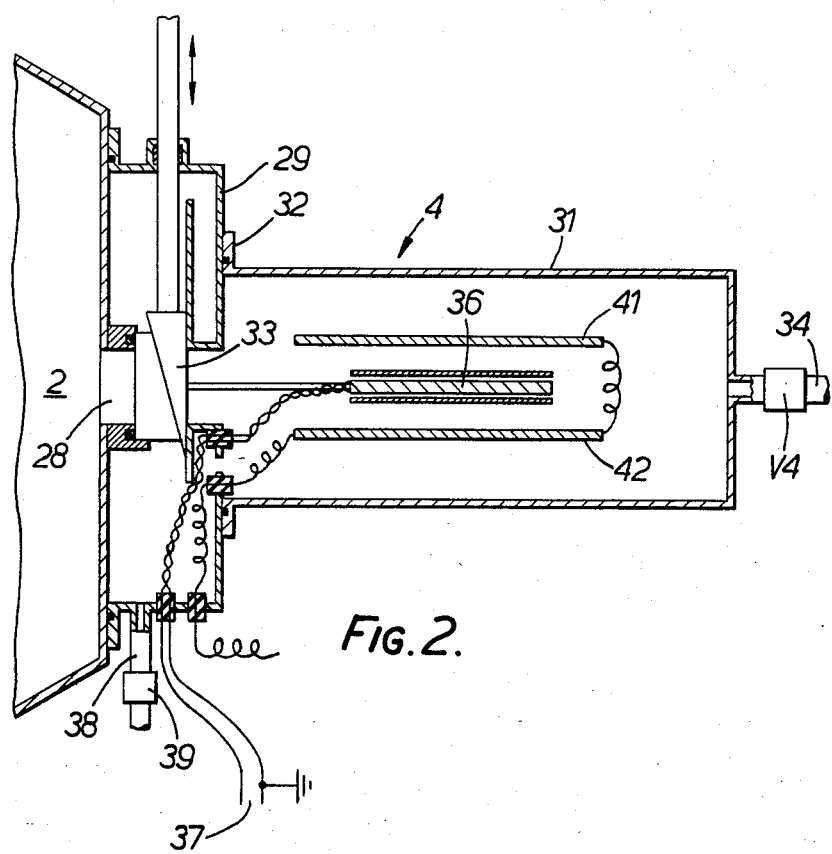
FIG. 2 is a schematic horizontal section on an enlarged scale compared to FIG. 1 of a deposition chamber of the apparatus in FIG. 1.

The construction of the deposition chambers 4, 5, 6 and 7 is illustrated in more detail in FIG. 2 which is a schematic horizontal section through one of these chambers. The deposition chambers are each composed of an inner fixed part 29 and an outer detachable part 31 with a flange 32, bolted to fixed part 29, at its inner end. A slide valve 33 is provided at the inner end of the deposition chamber to seal the port between the deposition chamber and transfer chamber 2. The deposition chamber is connected by a duct 34 opening into the detachable part 31 of the chamber through valve V4 to a pump P4 for evacuation of the chamber.

Each of the inlet chamber 3, the deposition chambers 4, 5, 6 and 7 and the outlet chamber 8 opens into the transfer chamber via a port sealed by a valve similar to slide valve 33.

A vertical heated support 36 for a substrate carrier is provided in the detachable part 31 of the deposition chamber mounted on supports attached to the inner fixed part 29. An insulated electrical supply for heated support 36 is provided via fixed part 29 as shown at 37. A duct 38 for the supply of coating gas controlled by valve 39 opens into the fixed part of the chamber. Flat plate electrodes 41 and 42 are vertically mounted in detachable part 31 of the deposition chamber on either side of and parallel to the heated support 36.

Deposition chamber 8, for deposition of a metal layer, is, like deposition chambers 4, 5, 6 and 7 constructed in 2 parts, a fixed inner part and a detachable outer part. The detachable outer part includes a rotatably mounted support for a carrier for substrates to be coated, and also electrically heated evaporators for evaporation of aluminium or other electrically conducting metal to be deposited on the substrates. The chamber 8 is connected to a pump P8 via valve V8 for evacuation of the chamber. An additional port at 40, controlled by a slide valve similar to valve 33 is provided at the outer end of chamber 8 for removal of a coated substrate from the apparatus. The deposition chamber 8 thus also serves as an outlet chamber. The support in chamber 8 is mounted for rotation about a horizontal axis directed towards the axis 20 of rotation of transfer arm 13. The support is held vertical to receive a loaded substrate carrier from transfer arm 13, and can then be rotated to bring the substrate carrier horizontal while a substrate is coated from aluminium evaporators below the support. When the carrier carries two parallel substrates to be coated, the support can be rotated through 180° to coat the second substrate.

Figure 3:
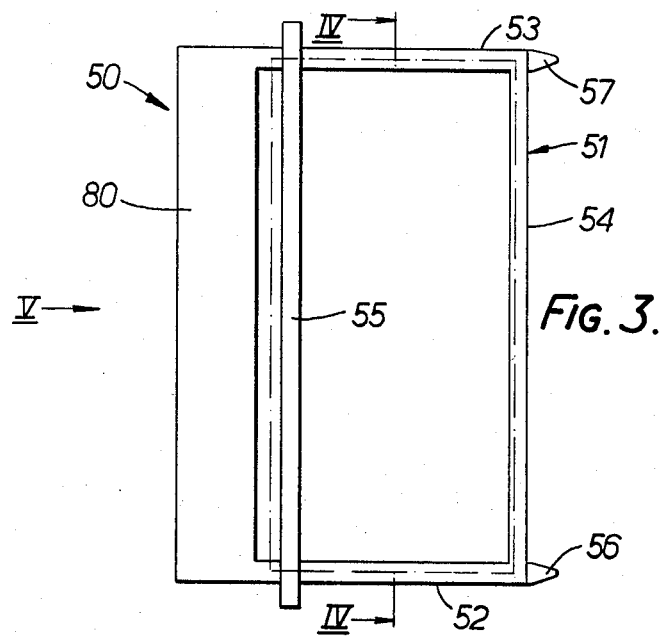
FIG. 3 is a side elevation on an enlarged scale compared to FIG. 1 of a substrate carrier for use in the apparatus of the present invention.
Figure 4:
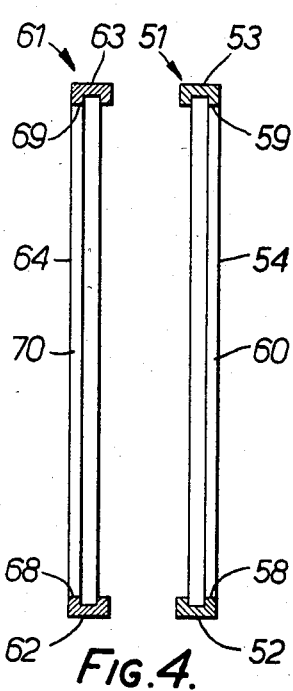
FIG. 4 is a section in the line IV—IV of the carrier shown in FIG. 3.
Figure 5:
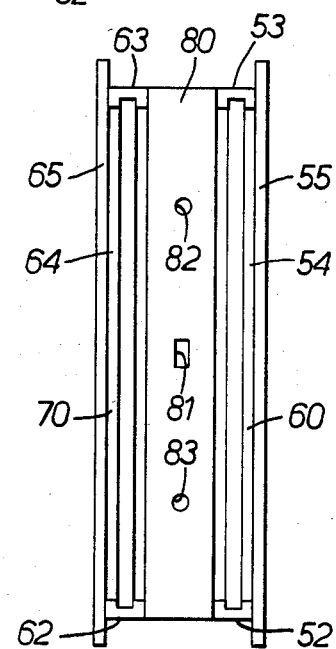
FIG. 5 is an end elevation of the carrier shown in FIG. 3 in the direction of arrow V in FIG. 3.

A substrate carrier shown in FIGS. 3, 4 and 5 and generally designated 50 comprises two similar light rectangular carrier frames 51 and 61 mounted back-to-back on a backbone support 80. The carrier frames 51, 61 have sides 52, 53 and 62, 63 respectively extending from backbone 80 and joined towards their outer ends by longer sides 54, 64 respectively. The sides 52, 53 and 62, 63 are of U-shaped cross section, and the longer sides 54, 64 are of L-shaped cross section, to retain a flat rectangular substrate in position in each of the frames. In addition, each of the carrier frames has a retaining bar 55, 65 secured to the outer faces of sides 52, 53 and 62, 63 adjacent to and parallel to backbone 80. The ends 56, 57 (and 66, 67 not shown) of sides 52, 53 and 62, 63 are tapered (see FIG. 3) where they extend beyond sides 54, 64. The carrier supports 36 in the deposition chambers, and similar supports in the inlet chamber and outlet chamber are provided with horizontal grooves which, in use, engage the inner faces of sides 52, 53 and 62, 63 of the carrier frames. In use, the carrier is presented to the supports 36 with its backbone support 80 vertical and carried on transfer arm 13 of the transfer means 12. The tapered ends 56, 57 and 66, 67 of the sides 52, 53 and 62, 63 of the carrier frames assist in guiding the sides 52, 53 and 62, 63 into the slots in the support 36. When a loaded carrier 50 is in position on a carrier support 36, the substrates are sandwiched between the outer retaining lips 58, 59, 60 and 68, 69, 70 (FIG. 4) of the sides 52, 53, 54 and 62, 63, 64 of the carrier frames on one side and the side faces of support 36 on the other side. The substrates mounted in the carrier frames on the support 36 are thus in contact with the support and face the flat plate electrodes 41 and 42 in the deposition chamber.

The backbone 80 of substrate carrier 50 is shown in FIG. 5. It is provided with a rectangular aperture 81 at the centre thereof for engagement of the carrier 50 by transfer arm 13 of transfer means 12, and with bored holes 82, 83 into which locating rods on the transfer arm fit when the substrate carrier is engaged by the transfer arm.

Figure 8:
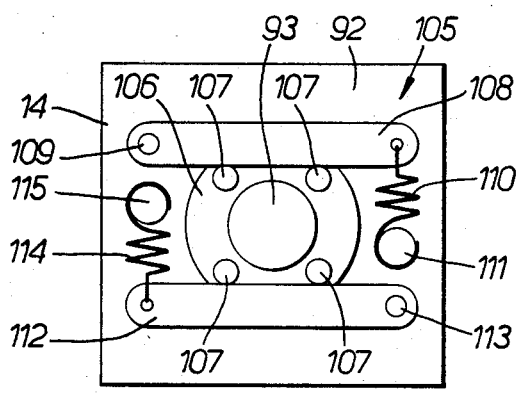
FIG. 8 is a rear elevation on an enlarged scale compared to FIG. 7 in the direction of arrow VIII in FIG. 7 showing a latch mechanism.
Figure 6:
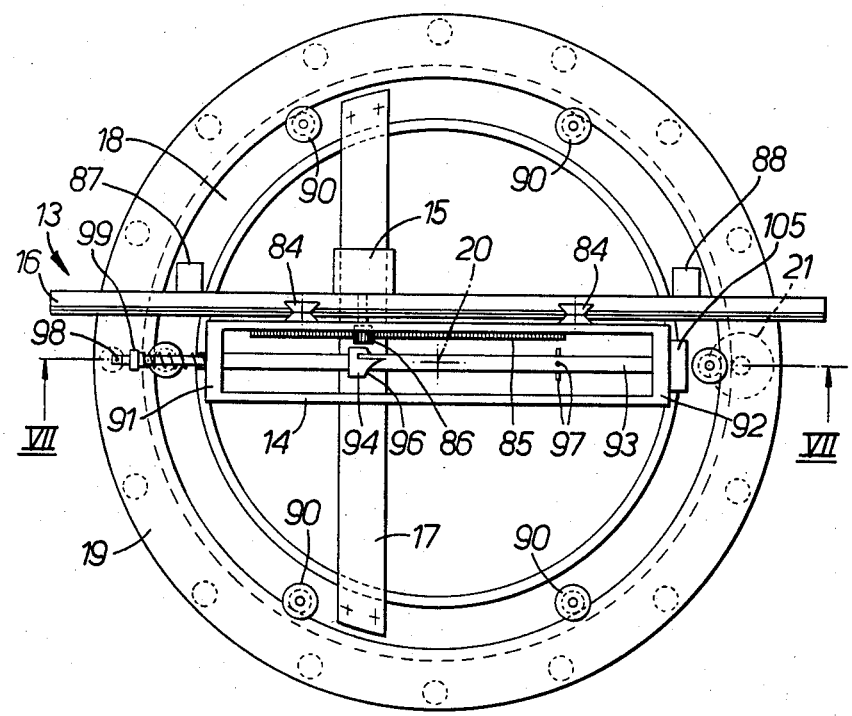
FIG. 6 is a plan view on an enlarged scale compared to FIG. 1 of the transfer mechanism shown in FIG. 1, omitting the detail of the latch mechanism shown in FIG. 8.
Figure 7:
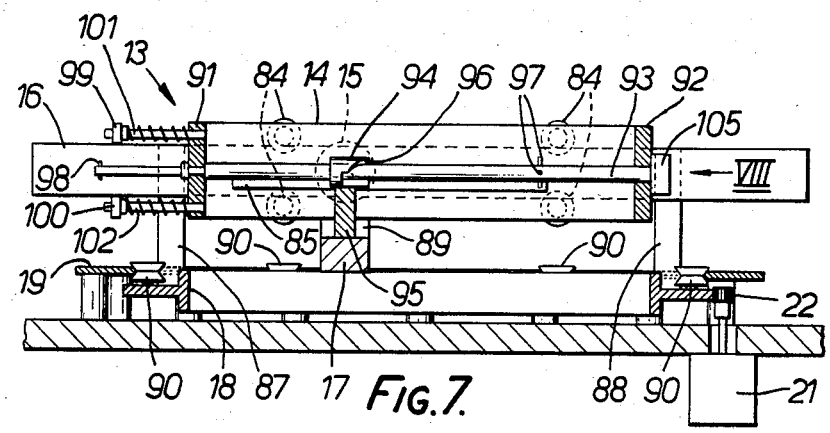
FIG. 7 is a vertical section on line VII—VII in FIG. 6, again omitting the detail of the latch mechanism.

Transfer means 12 is illustrated in more detail in FIGS. 6, 7 and 8. It comprises a horizontally reciprocable transfer arm 13 comprising carriage 14 mounted on a rail 16 by rollers 84. Carriage 14 carries a rack 85 which engages a pinion 86 driven by motor 15 for horizontal reciprocation of carriage 14 along rail 16. The rail 16 is mounted on a turntable 18 by supports 87, 88 (FIG. 7) and on horizontal beam 17, also carried by turntable 18, by support 89. Turntable 18 is journalled by rollers 90 for rotation in annular support 19 about vertical axis 20 at the centre of transfer chamber 2 (FIG. 1). Motor 21 drives drive wheel 22 which engages the periphery of turntable 18 for rotation of the turntable.

Carriage 14 has front and back walls 91, 92 and a longitudinal shaft 93 mounted for rotation in the front and back walls. The shaft 93 passes through and is rotatable within a fixed sleeve 94 carried by support 95 on beam 17. Sleeve 94 has a cam surface 96 and shaft 93 has four equispaced projecting rods 97 extending radially therefrom for engagement with cam surface 96 when carriage 14 is advanced along rail 16. In the position of the shaft shown in FIGS. 6, 7 and 8, the projecting rods extend vertically and horizontally. The forward end of shaft 93 is provided with a bayonet fitting 98 comprising two prongs extending radially from shaft 93; in the position of the shaft shown in FIGS. 6, 7 and 8 the two prongs of the bayonet fitting extend vertically up and down. In use the bayonet fitting engages in rectangular aperture 81 in backbone 80 of substrate carrier 50. Carriage 14 also carries spring loaded annular collars 99, 100 on horizontal rods 101, 102 above and below shaft 93. When carriage 14 picks up a carrier 50, rods 101, 102 fit into bored holes 82, 83 in backbone 80 of the carrier and the collars 99, 100 engage the outer face of backbone 80 to positively locate the carrier in position on carriage 14.

The function of sleeve 94 with its cam surface 96 is more fully described below. As carriage 14 is advanced along rail 16 into a deposition chamber (or inlet chamber) to pick up a substrate carrier 50 mounted on a support 36 with its backbone 80 facing carriage 14, bayonet fitting 98 passes through aperture 81 in backbone 80 with its prongs vertical (as in FIG. 7). The vertical rod 97 projecting upwards from longitudinal shaft 93 engages cam surface 96 of sleeve 94, rotating shaft 93 through 90° as it slides over the cam surface; thus the bayonet fitting 98 is rotated through 90° bringing its prongs horizontal so that they engage the inner face of backbone 80 when carriage 14 is withdrawn. At the same time, rods 101, 102 engage in bored holes 82, 83 in backbone 80 of carrier 50 and spring loaded collars 99, 100 engage the outer face of backbone 80 locating the carrier 50 positively in position on carriage 14. The carriage 14 is then withdrawn along rail 16 withdrawing the substrate carrier from the support 36 into transfer chamber 2. The transfer arm may then be rotated by rotating turntable 18 by motor 21 and drive wheel 22 until transfer arm 13 is directed towards a support in a deposition chamber or outlet chamber in which the carrier is to be deposited. Carriage 14 is then advanced along rail 16 sliding carrier 50 onto a support 36 in the chosen chamber. As the carriage advances along rail 16, shaft 93 advances through sleeve 94 and the next of the projecting rods 97, now directed vertically upwards, engages cam surface 95 rotating longitudinal shaft 93 through a further 90° so that the prongs of bayonet fitting 98 are returned to the vertical. The carriage 14 is then withdrawn along rail 16. The bayonet fitting withdraws through longitudinal aperture 81 as spring loaded collars 99, 100 bear on the outer face of backbone 80 of carrier 50 ensuring that carrier 50 is released from shaft 93 and remains in position on support 36. The pick up and deposition of carriers 50 on supports 36 by carriage 14 of transfer arm 13 can be repeated as required.

Carriage 14 is provided with latch mechanism 105, the structure of which is shown in FIG. 8. A disc 106 is fixedly mounted on the rearward end of the longitudinal shaft 93 where it extends through back wall 92 of carriage 14. Four rods 107 extend rearwardly from the back face of disc 106. Rods 107 are disposed radially about the axis of shaft 93 displaced at 45° from projecting rods 97 on shaft 93. A latch member 108 is pivotally mounted at one end on pivot 109 above shaft 93 and biased downwardly at its other end by spring 110 secured to stud 111. A second latch member 112 pivotally mounted at one end on pivot 113, diametrically opposite pivot point 109, is biased upwardly at its other end by spring 114 secured to stud 115. The spring biased latch members 108, 112 bear on rods 107 carried on disc 106 mounted on shaft 93 urging the shaft into rest positions with the rods 107 in the position shown so that the prongs of bayonet fitting 98 extend either exactly horizontally or exactly vertically. The latch mechanism thus operates to ensure positive engagement and disengagement of bayonet fitting 98 with backbone 80 of substrate carrier 50.

The use of the apparatus to produce photovoltaic cells on a glass substrate will now be described. First, the ports between the deposition chambers 4, 5, 6, 7, 8 and the transfer chamber 2, the port at 28 between the inlet chamber 3 and the transfer chamber 2, and the outlet port at 40 of deposition chamber 8 were closed and the deposition chamber and transfer chamber evacuated. In order to avoid any cross-contamination of the silicon layers which were to be deposited in deposition chambers 4, 5, 6, and 7, the transfer chamber 2 was evacuated to, and maintained at, a lower pressure than any of chambers 4, 5, 6 and 7. Thus, any gas flow between these deposition chambers and the transfer chamber 2 was always in the direction of the transfer chamber and not into these deposition chambers. Two rectangular panes of 2 mm thick float glass, coated on one side with an electrically conducting indium tin oxide coating were mounted in a carrier as illustrated in FIG. 3 with the coated faces facing outward. The carrier was then mounted on a support, similar to the support 36 in the deposition chambers, and the support introduced into inlet chamber through the loading port at 25 and mounted in the inlet chamber with the backbone support 80 of the carrier vertical and facing inwards towards the transfer chamber 2. The valve controlling the loading port was closed, and the inlet chamber evacuated. The valve between the inlet chamber and transfer chamber was opened and turntable 18 rotated about axis 20 until arm 13 was directed towards the carrier 50 in inlet chamber 3. The carriage 14 was advanced along rail 16 to engage carrier 50, and then retracted withdrawing carrier 50 into the transfer chamber 2. Turntable 18 was rotated until arm 13 was directed towards the support 36 in deposition chamber 4. Valve V4, controlling the evacuation of deposition chamber 4 was closed and the slide valve 33 between deposition chamber 4 and transfer chamber 2 was opened and carriage 14 advanced towards deposition chamber 4 to deposit carrier 50 on heated support 36. Carriage 14 was then retracted along rail 16, and the valve 33 controlling the port between deposition chamber 4 and transfer chamber 2 was closed.

A coating gas containing 50% monosilane (SiH$_4$), 39.6% argon and 0.4% diborane (B$_2$H$_6$) by volume was introduced into deposition chamber 4 through duct 38 and the valve V4 adjusted to maintain a gas pressure of about 0.5 torr in the deposition chamber. When the glass substrates had been heated to a temperature of about 270° C. by electrically heated support 36, a D.C. voltage of 1 Kv was applied between electrodes 41, 42 and the heated support. The resultant glow discharge caused silane and diborane to decompose depositing a p-doped layer of amorphous silicon on the oxide coated faces of the glass substrates. The discharge was continued until p-doped layers approximately 10 nm thick had been deposited on the glass substrates. The voltage supply to the electrodes was switched off and valve 39 controlling the supply of coating gas closed. When the pressure in deposition chamber 4 had fallen to a value close to the pressure in transfer chamber 2, valve V4 was closed. The slide valve 33 was opened and carriage 14 advanced towards deposition chamber 4 to engage carrier 50 and then retracted withdrawing carrier 50 into transfer chamber 2.

Turntable 18 was then rotated until arm 13 was directed towards support 36 in deposition chamber 5. The carrier was then introduced into deposition chamber 5 by carriage 14 and intrinsic silicon layers approximately 500 nm deposited on top of the p-doped layers in a similar manner to that described above, except that 100% monosilane was used as the coating gas.

While the intrinsic layers were being deposited in deposition chamber 5, a second carrier loaded with 2 rectangular panes of float glass bearing electrically conducting indium tin oxide coatings was introduced through inlet chamber 3 and transfer chamber 2 into deposition chamber 4, a p-doped layers of amorphous silicon 10 nm thick deposited on the oxide coatings. The second carrier was then transferred by transfer means 12 from deposition chamber 4 via transfer chamber 2 to deposition chamber 6 for deposition of intrinsic layers of silicon approximately 500 nm thick on the p-doped layers.

When deposition of the intrinsic layers in deposition chamber 5 was complete, the first carrier was transferred by transfer means 12 via transfer chamber 2 from deposition chamber 5 to deposition chamber 7. In deposition chamber 7, n-doped layers of amorphous silicon approximately 20 nm thick were deposited on the intrinsic layers in a similar manner to that described above, except that a coating gas containing 60% monosilane, 39.6% argon and 0.4 phosphine (PH$_3$) by volume was used. The carrier was then transferred by transfer means 12 via transfer chamber 2 to deposition chamber 8 for deposition of aluminium layers 200 nm thick on top of the n-doped silicon layers in known manner. The carrier bearing the coated substrates was then withdrawn from the apparatus through outlet port 40 at the outer end of deposition chamber 8.

After the first carrier had been withdrawn from deposition chamber 7 and the intrinsic layers had been deposited on the substrates on the second carrier in deposition chamber 6, the second carrier was transferred by transfer means 12 via transfer chamber 2 to deposition chamber 7 for deposition of layers of n-doped silicon approximately 20 nm thick on the intrinsic silicon layers. It was then transferred by transfer means 12 via transfer chamber 2 to deposition chamber 8 for deposition of layers of aluminium approximately 200 nm thick in known manner on the layers of n-doped silicon, and then withdrawn from the apparatus through outlet port 40 at the outer end of deposition chamber 8.

It will be understood that further substrates may be introduced into deposition chamber 4 as soon as it has been vacated, and, in the process described the productive capacity of the apparatus is limited by the time taken to deposit the relatively thick intrinsic silicon layers in deposition chambers 4 and 5. However, by providing two chambers for the deposition of intrinsic layers, as opposed to the single chamber of an in-line apparatus with three similar sized chambers for the deposition of the p-doped, intrinsic and n-doped layers, an apparatus with a productive capacity substantially twice that of the in-line apparatus is obtained. The capacity of the apparatus can be increased further by providing additional chambers e.g. in an octagonal arrangement, for deposition of intrinsic silicon layers. By using an octagonal arrangement, six deposition chambers may be provided for depositing silicon layers in addition to the inlet chamber and outlet chamber. Of the six chambers, four are preferably used for deposition of intrinsic layers, and one each for deposition of p-doped and n-doped layers.

A further advantage of the apparatus, when compared with a continuous in-line apparatus, is that the deposition times in the individual chambers may be varied independently without changing the dimensions of the chambers. Moreover, because of the arrangement of the deposition chambers opening into a common transfer chamber, individual chambers may be taken out of use and dismantled for maintenance or modification without affecting the operation of the other chambers. Maintenance of the chambers used for deposition by gas discharge may be further simplified by using the chamber walls as electrodes so avoiding the need for separate electrodes such as 41 and 42. In this case, at least the detachable outer part 31 of the deposition chamber is constructed of electrically conductive material, for example stainless steel (which is in fact a preferred material for fabrication of all the chambers) and is electrically isolated from fixed inner part 29 and duct 34 by PTFE insulating gaskets. The support 36 is earthed, so earthing the glass and glass carrier, and the chamber wall connected to an appropriate RF source or DC source at a negative potential relative to earth. If necessary, glass insulating pieces are placed over the top, bottom and end walls of the chamber to ensure that the gas discharge is generally normal to the glass substrates; alternatively, the need for such insulating pieces may be avoided by so dimensioning the chamber that gas discharge takes place preferentially from walls parallel to the plane of the glass and any discharge from other walls is negligible.

I claim:

1. An apparatus for deposition of multi-layer coatings on substrates comprising an evacuable transfer chamber, at least 3 evacuable deposition chambers disposed around the transfer chamber and extending radially away from an axis with the transfer chamber, means for evacuating each of said deposition chambers, and coating means in each of said deposition chambers for depositing a coating layer on a substrate, said evacuable transfer chamber having closable ports providing communication between said transfer chamber and each of said deposition chambers for transfer of a substrate to be coated between said deposition chambers, means for evacuating said transfer chamber, and transfer means rotatably mounted in said transfer chamber for rotation about said axis in the transfer chamber for transferring a substrate between said deposition chambers via the transfer chamber.

2. An apparatus according to claim 1 in which said deposition chambers are disposed on the arc of a circle around the transfer chamber.

3. An apparatus according to claim 1 wherein the transfer means comprises a transfer arm rotatably mounted in the transfer chamber for rotation about an axis in the transfer chamber.

4. An apparatus according to claim 1 which additionally comprises an evacuable inlet chamber with a closable entry port for introduction of a substrate, means for evacuating said inlet chamber, and a closable port between said inlet chamber and the transfer chamber for transfer of a substrate between said inlet chamber and the transfer chamber.

5. An apparatus according to claim 4 which additionally comprises an evacuable outlet chamber with a closable outlet port for removal of a substrate, means for evacuating said outlet chamber, and a closable port between said outlet chamber and the transfer chamber for transfer of a substrate between the transfer chamber and said outlet chamber.

6. An apparatus according to claim 1 which additionally comprises an evacuable outlet chamber with a closable outlet port for removal of a substrate, means for evacuating said outlet chamber, and a closable port between said outlet chamber and the transfer chamber for transfer of a substrate between the transfer chamber and said outlet chamber.

7. An apparatus according to claim 1 which comprises means for supplying a coating gas to each of said deposition chambers and electrode means for generation of a glow discharge in each of said deposition chambers with deposition of a coating on a substrate in that chamber.

8. An apparatus according to claim 1 comprising an additional evacuable deposition chamber, a closable port between said additional chamber and the transfer chamber, means for evacuating said additional chamber, and heating means in said chamber for evaporation of a metal and deposition of a coating of said metal on a substrate in the chamber.

9. An apparatus according to claim 1, comprising an evacuable transfer chamber, at least 4 evacuable deposition chambers disposed around the transfer chamber and extending radially away from an axis within the transfer chamber, means for evacuating each of said deposition chambers, and coating means in each of said chambers for depositing a coating layer on a substrate, said evacuable transfer chamber having closable ports providing communication between said transfer chamber and each of said deposition chambers for transfer of a substrate to be coated between said deposition chambers, means for evacuating said transfer chamber, and transfer means rotatably mounted in said transfer chamber for rotation about said axis in the transfer chamber for transferring a substrate between said deposition chambers via the transfer chamber.

10. An apparatus according to claim 9 in which said deposition chambers are disposed on the arc of a circle around the transfer chamber.

11. An apparatus according to claim 9 wherein the transfer means comprises a transfer arm rotatably mounted in the transfer chamber for rotation about an axis in the transfer chamber.

12. An apparatus according to claim 9 which additionally comprises an evacuable inlet chamber with a closable entry port for introduction of a substrate, means for evacuating said inlet chamber, and a closable port between said inlet chamber and the transfer chamber for transfer of a substrate between said inlet chamber and the transfer chamber.

13. An apparatus according to claim 12 which additionally comprises an evacuable outlet chamber with a closable outlet port for removal of a substrate, means for evacuating said outlet chamber, and a closable port between said outlet chamber and the transfer chamber for transfer of a substrate between the transfer chamber and said outlet chamber.

14. An apparatus according to claim 9 which additionally comprises an evacuable outlet chamber with a closable outlet port for removal of a substrate, means for evacuating said outlet chamber, and a closable port between said outlet chamber and the transfer chamber for transfer of a substrate between the transfer chamber and said outlet chamber.

15. An apparatus according to claim 9 which comprises means for supplying a coating gas to each of said deposition chambers and electrode means for generation of a glow discharge in each of said deposition chambers with deposition of a coating on a substrate in that chamber.

16. An apparatus according to claim 9 comprising an additional evacuable deposition chamber, a closable port between said additional chamber and the transfer chamber, means for evacuating said additional chamber, and heating means in said chamber for evaporation of a metal and deposition of a coating of said metal on a substrate in the chamber.

* * * * *